(12) United States Patent
Hayahara

(10) Patent No.: US 11,201,076 B2
(45) Date of Patent: Dec. 14, 2021

(54) ELECTROSTATIC CHUCK DEVICE

(71) Applicant: SUMITOMO OSAKA CEMENT CO., LTD., Tokyo (JP)

(72) Inventor: Ryuuji Hayahara, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 95 days.

(21) Appl. No.: 16/761,461

(22) PCT Filed: Nov. 6, 2018

(86) PCT No.: PCT/JP2018/041134
§ 371 (c)(1),
(2) Date: May 4, 2020

(87) PCT Pub. No.: WO2019/098087
PCT Pub. Date: May 23, 2019

(65) Prior Publication Data
US 2020/0395235 A1 Dec. 17, 2020

(30) Foreign Application Priority Data
Nov. 15, 2017 (JP) .............................. JP2017-220459

(51) Int. Cl.
*H01L 21/683* (2006.01)
*H01L 21/67* (2006.01)
*H01L 21/687* (2006.01)

(52) U.S. Cl.
CPC .... *H01L 21/6833* (2013.01); *H01L 21/67103* (2013.01); *H01L 21/67109* (2013.01); *H01L 21/68785* (2013.01)

(58) Field of Classification Search
CPC ......... H01L 21/67103; H01L 21/67109; H01L 21/6719; H01L 21/67248; H01L 21/6831;
(Continued)

(56) References Cited

U.S. PATENT DOCUMENTS

| 9,343,346 B2 * | 5/2016 | Kosakai | ............ H01L 21/67103 |
| 2019/0019713 A1 * | 1/2019 | Hidaka | ................. C04B 35/103 |
| 2020/0343125 A1 * | 10/2020 | Kinpara | ............... H01L 21/6833 |

FOREIGN PATENT DOCUMENTS

| JP | 2008-300491 A | 12/2008 | |
| JP | 2016129183 A * | 7/2016 | |
| JP | 6064908 B2 * | 1/2017 | ......... H01L 21/6831 |

OTHER PUBLICATIONS

International Search Report for PCT/JP2018/041134 (dated Jan. 29, 2019).

* cited by examiner

*Primary Examiner* — Jared Fureman
*Assistant Examiner* — Nicolas Bellido
(74) *Attorney, Agent, or Firm* — Merchant & Gould P.C.

(57) ABSTRACT

This electrostatic chuck device includes an electrostatic chuck part which has a placement surface on one main surface thereof to place a plate-shaped sample and has an electrode for electrostatic attraction; a temperature controlling base part configured to cool the electrostatic chuck part; and a heater element disposed between the electrostatic chuck part and the temperature controlling base part, in which the electrostatic chuck part and the temperature controlling base part are parts in which a plurality of through holes communicating in a thickness direction are provided, the heater element has a first site formed in a band shape and a second site continuous with the first site, wherein the second site is formed to have in a band shape and a closed ring shape, one through hole of the through holes is disposed on an inner peripheral side of the second site in plan view.

12 Claims, 5 Drawing Sheets

(58) Field of Classification Search
CPC ............. H01L 21/6833; H01L 21/6875; H01L 21/68764; H01L 21/68771; H01L 21/68785
See application file for complete search history.

ELECTROSTATIC CHUCK DEVICE

TECHNICAL FIELD

The present invention relates to an electrostatic chuck device.

This application is a U.S. National Stage Application under 35 U.S.C. 071 of International Patent Application No. PCT/JP2018/041134, filed on Nov. 6, 2018, which claims priority to Japanese Patent Application No. 2017-220459, filed on Nov. 15, 2017, the disclosures of all of which are hereby incorporated by reference in their entireties.

BACKGROUND

In a semiconductor manufacturing apparatus using plasma, such as a plasma etching apparatus and a plasma CVD apparatus of the related art, an electrostatic chuck device is used as a device easily attaching and fixing a wafer to a sample table and maintaining the wafer at a desired temperature.

The surface temperature of the wafer rises when the wafer fixed to the electrostatic chuck device is irradiated with plasma in the plasma etching apparatus. Although the wafer is cooled from a lower side by a cooling medium such as water being circulated through a temperature controlling base part of the electrostatic chuck device so that this rise in surface temperature is suppressed, the wafer may undergo an in-plane temperature difference at this time.

For example, the temperature of the center portion of the wafer increases and the temperature of the peripheral edge side of the wafer decreases. Further, the state of generation of the plasma changes due to, for example, a difference in the structure and method of the plasma etching apparatus, and thus the wafer undergoes an in-plane temperature difference. In addition, even in an apparatus performing various types of film formation on the wafer, the wafer undergoes an in-plane temperature difference as the wafer is affected by film formation conditions or atmosphere control in a film formation chamber.

An electrostatic chuck device having a heater function has been proposed in this regard, and a heater member is attached between an electrostatic chuck part and a temperature controlling base part (Patent Literature No. 1). According to such an electrostatic chuck device, it is possible to heat a region having a relatively low temperature in a wafer surface, and thus it is possible to reduce a temperature difference that may arise in the wafer surface.

CITATION LIST

Patent Literature

[Patent Literature No. 1] Japanese Laid-open Patent Publication No. 2008-300491

SUMMARY OF INVENTION

Technical Problem

As described above, the wafer placed on the electrostatic chuck device is heated by plasma or a heater and cooled by the temperature controlling base part. However, a plurality of through holes into which, for example, a lift pin used for wafer placement and detachment is inserted are formed in the temperature controlling base part. In the temperature controlling base part, the manner in which heat is transmitted differs between the position where the through hole is formed and a through hole-less position. Accordingly, the wafer is likely to undergo a temperature difference at a position overlapping the through hole of the temperature controlling base part.

Likewise, the shape and design of the temperature controlling base part result in a plurality of wafer positions where a difference in temperature is likely to arise.

The present invention has been made in view of such circumstances, and an object of the present invention is to provide an electrostatic chuck device having a novel structure and capable of reducing the in-plane temperature difference of a wafer.

Solution to Problem

In order to solve the above problems, the present invention provides the following device.

In other words, one aspect of the present invention is the following device.

Provided is an electrostatic chuck device including an electrostatic chuck part which has a placement surface on one main surface thereof to place a plate-shaped sample and has an electrode for electrostatic attraction, a temperature controlling base part which is provided at a side opposite to the placement surface of the electrostatic chuck part electrostatic chuck part and is configured to cool the electrostatic chuck part, and a heater element disposed between the electrostatic chuck part and the temperature controlling base part or in the electrostatic chuck part in a layer form, in which the electrostatic chuck part and the temperature controlling base part are parts in which a plurality of through holes communicating in a thickness direction are provided, the heater element has a first site formed in a band shape and a second site continuous with the first site, wherein the second site is formed to have a band shape and a closed ring shape, at least one through hole of the through hole is disposed on an inner peripheral side of the second site in plan view, and a width of the second site is in a range of 0.25 times to 0.75 times a width of the first site.

In a first aspect of the present invention, a shape of an inner peripheral edge of the second site in plan view may be configured to protrude (be convex) to the first site side as compared with a virtual inscribed circle of the inner peripheral edge.

In the first aspect of the present invention, the width of the second site may be configured to be in a range of 0.45 times to 0.55 times the width of the first site.

In addition, a second aspect of the present invention is the following device.

Provided is an electrostatic chuck device including an electrostatic chuck part which has a placement surface on one main surface thereof to place a plate-shaped sample and has an electrode for electrostatic attraction, a temperature controlling base part which is provided at a side opposite to the placement surface of the electrostatic chuck part and is configured to cool the electrostatic chuck part, and a heater element disposed between the electrostatic chuck part and the temperature controlling base part or in the electrostatic chuck part in a layer form, in which the electrostatic chuck part and the temperature controlling base part are parts in which a plurality of through holes communicating in a thickness direction are provided, the heater element has a first site formed in a band shape and a second site continuous with the first site, wherein the second site is formed to have a band shape and a closed ring shape, the through hole is disposed on an inner peripheral side of the second site in plan view, and a shape of an inner peripheral edge of the second site in plan view protrudes to a first site side as compared with a virtual inscribed circle of the inner peripheral edge.

In the second aspect, it is also preferable that a width of the second site is in a range of 0.25 times to 0.75 times a width of the first site.

In the first and second aspects of the present invention, the heater element may be configured to be disposed in a circular region and may have the first site which is configured to extend in a circumferential direction of the circular region.

In the first and second aspects of the present invention, the heater element may be configured to be disposed in a circular region and may have the first site which is configured to extend in a radial direction of the circular region.

In the first and second aspects of the present invention, the heater element may be configured to be disposed in a circular region and may have the first site which is configured to extend in a direction obliquely intersecting with a radial direction of the circular region.

Advantageous Effects of Invention

According to the present invention, it is possible to provide an electrostatic chuck device having a novel structure and capable of reducing the in-plane temperature difference of a wafer.

DESCRIPTION OF EMBODIMENTS

Hereinafter, an electrostatic chuck device according to the present embodiment, which is a preferred example of the present invention, will be described with reference to FIGS. 1 to 9. It should be noted that the dimensions, ratios, and the like of components in each of the following drawings may be appropriately changed in order to make the drawings easy to see. In addition, the following example specifically describes the preferred example for better understanding of the spirit of the invention and does not limit the present invention unless otherwise specified. Omissions, additions, substitutions, and other changes can be made with regard to lengths, positions, shapes, numbers, amounts, materials, and the like without departing from the spirit of the present invention.

Figure 1:
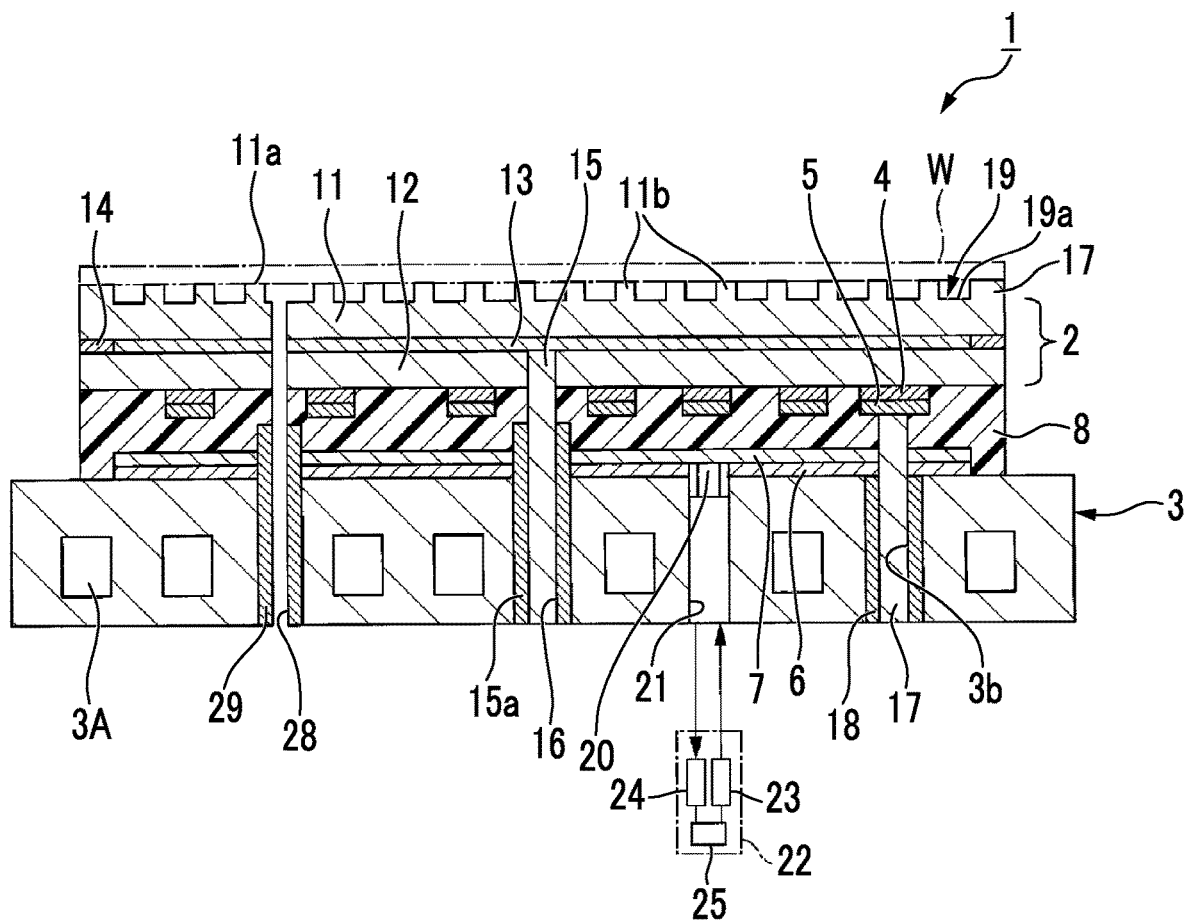
FIG. 1 is a schematic cross-sectional view illustrating a preferred example of an electrostatic chuck device of the present embodiment.

FIG. 1 is a schematic cross-sectional view illustrating an example of the electrostatic chuck device of a first embodiment of the present invention. An electrostatic chuck device 1 of this form includes an electrostatic chuck part 2, a temperature controlling base part 3, and a heater element 5.

The electrostatic chuck part 2 has a disk shape and has one main surface (upper surface) side as a placement surface. The temperature controlling base part 3 is a disk-shaped member provided below the electrostatic chuck part 2 and adjusting the electrostatic chuck part 2 to a desired temperature. The heater element 5 is disposed between the electrostatic chuck part 2 and the temperature controlling base part 3.

In addition, the electrostatic chuck part 2 and the temperature controlling base part 3 are bonded to each other via an adhesive layer 8 provided between the electrostatic chuck part 2 and the temperature controlling base part 3.

The electrostatic chuck part 2 has a placement plate 11 having an upper surface that is a placement surface 11a on which a plate-shaped sample W such as a semiconductor wafer is placed, a supporting plate 12 integrated with the placement plate 11 and supporting the placement plate 11 from a bottom portion side, an electrode for electrostatic attraction (internal electrode for electrostatic attraction) 13 provided between the placement plate 11 and the supporting plate 12, and an insulating material layer 14 insulating the periphery of the electrode for electrostatic attraction 13.

The placement plate 11 and the supporting plate 12 are disk-shaped plates and the surfaces of the placement plate 11 and the supporting plate 12 that overlap each other have the same shape. These plates are preferably made of an insulating ceramics sintered body having mechanical strength and durability against corrosive gas and the plasma thereof, examples of which include an aluminum oxide-silicon carbide ($Al_2O_3$—SiC) composite sintered body, an aluminum oxide ($Al_2O_3$) sintered body, an aluminum nitride (AlN) sintered body, and an yttrium oxide ($Y_2O_3$) sintered body.

A plurality of projection portions 11b, which have a diameter smaller than the thickness of the plate-shaped sample, are formed on the placement surface 11a of the placement plate 11. The interval at which the plurality of projection portions 11b are formed may be any selectable and predetermined interval. These projection portions 11b support the plate-shaped sample W. A groove 19 surrounded by the plurality of projection portions 11b and a bottom surface 19a is formed around the projection portion 11b.

Although the total thickness that includes the placement plate 11, the supporting plate 12, the electrode for electrostatic attraction 13, and the insulating material layer 14, that is, the thickness of the electrostatic chuck part 2 is any selectable thickness, the thickness is formed to be, for example, 0.7 mm or more and 5.0 mm or less. The thickness is preferably formed to be 2.0 mm or more and 4.5 mm or less.

For example, it may be difficult to ensure the mechanical strength of the electrostatic chuck part 2 when the thickness of the electrostatic chuck part 2 is less than 0.7 mm. When the thickness of the electrostatic chuck part 2 exceeds 5.0 mm, the heat capacity of the electrostatic chuck part 2 increases, the thermal responsiveness of the placed plate-shaped sample W deteriorates, the lateral heat transfer of the electrostatic chuck part increases, and then it may be difficult to maintain the in-plane temperature of the plate-shaped sample W in a desired temperature pattern. It should be noted that the thickness of each portion described here is an example and is not limited to the above range.

The electrode for electrostatic attraction 13 is used as an electrode for an electrostatic chuck for generating an electric charge and fixing the plate-shaped sample W with an electrostatic attraction force. The shape and size of the electrode for electrostatic attraction 13 are appropriately adjusted depending on the application.

The electrode for electrostatic attraction 13 can be formed of any selected material. However, it is preferable that the electrode for electrostatic attraction 13 is formed of a material selected from, for example, conductive ceramics such as an aluminum oxide-tantalum carbide ($Al_2O_3$—$Ta_4C_5$) conductive composite sintered body, an aluminum oxide-tungsten ($Al_2O_3$—W) conductive composite sintered body, an aluminum oxide-silicon carbide ($Al_2O_3$—SiC) conductive composite sintered body, an aluminum nitride-tungsten (AlN—W) conductive composite sintered body, an aluminum nitride-tantalum (AlN—Ta) conductive composite sintered body, and an yttrium oxide-molybdenum ($Y_2O_3$—Mo) conductive composite sintered body or high melting point metal such as tungsten (W), tantalum (Ta), and molybdenum (Mo).

The thickness of the electrode for electrostatic attraction 13 can be any selectable thickness and is not particularly limited. For example, a thickness of 0.1 μm or more and 100 μm or less can be selected and a thickness of 5 μm or more and 20 μm or less is more preferable.

It may be difficult to ensure sufficient conductivity when the thickness of the electrode for electrostatic attraction 13 is less than 0.1 μm. When the thickness of the electrode for electrostatic attraction 13 exceeds 100 μm, cracks may be easily formed at the bonding interface between the electrode for electrostatic attraction 13 and the placement plate 11 and supporting plate 12 due to the thermal expansion coefficient difference between the electrode for electrostatic attraction 13 and the placement plate 11 and supporting plate 12.

The electrode for electrostatic attraction 13 having such a thickness can be easily formed by a film forming method such as a sputter method and an evaporation method or a coating method such as a screen printing method.

The insulating material layer 14 protects the electrode for electrostatic attraction 13 from corrosive gas and the plasma thereof by surrounding the electrode for electrostatic attraction 13 and joins and integrates the boundary portion between the placement plate 11 and the supporting plate 12, that is, an outer peripheral portion region other than the electrode for electrostatic attraction 13. The insulating material layer 14 is preferably configured by an insulating material having the same composition or main component as the material by which the placement plate 11 and the supporting plate 12 are configured.

A power supply terminal 15 for applying a direct current voltage to the electrode for electrostatic attraction 13 is connected to the electrode for electrostatic attraction 13. The power supply terminal 15 is inserted in a through hole 16, which penetrates the temperature controlling base part 3, the adhesive layer 8, and the supporting plate 12 in a thickness direction. An insulator 15a having insulating properties is provided on the outer peripheral side of the power supply terminal 15, and the insulator 15a insulates the power supply terminal 15 from the metallic temperature controlling base part 3.

Although the power supply terminal 15 is illustrated as an integrated member in the drawing, the power supply terminal 15 may be configured by a plurality of members being electrically connected. The power supply terminal 15 is inserted in the temperature controlling base part 3 and the supporting plate 12, which have different thermal expansion coefficients. Accordingly, for example, each part of the power supply terminal 15 inserted in the temperature controlling base part 3 and the supporting plate 12 may be configured by different materials.

The material of the part (extraction electrode) of the power supply terminal 15 that is connected to the electrode for electrostatic attraction 13 and inserted in the supporting plate 12 is not particularly limited insofar as the material is a conductive material having excellent heat resistance. Preferably, the material has a thermal expansion coefficient close to the thermal expansion coefficients of the electrode for electrostatic attraction 13 and the supporting plate 12. For example, the part is made of a conductive ceramic material such as $Al_2O_3$—TaC.

It is preferable that the part of the power supply terminal 15 that is inserted in the temperature controlling base part 3 is made of, for example, a metal material such as tungsten (W), tantalum (Ta), molybdenum (Mo), niobium (Nb), and a Kovar alloy.

The member of the part of the power supply terminal 15 that is connected to the electrode for electrostatic attraction 13 and inserted in the supporting plate 12 and the member of the part of the power supply terminal 15 that is inserted in the temperature controlling base part 3 may be connected with a silicone-based conductive adhesive having flexibility and electric resistance.

The temperature controlling base part 3 is a member for adjusting the electrostatic chuck part 2 to a desired temperature. Preferably, the temperature controlling base part 3 has a thick disk shape. Preferable as the temperature controlling base part 3 is, for example, a water cooling base in which a flow path 3A for water circulation is formed.

The material by which the temperature controlling base part 3 is configured is not particularly limited insofar as the material is metals having excellent thermal conductivity, conductivity, and workability or a compound material containing these metals. For example, aluminum (Al), an aluminum alloy, copper (Cu), a copper alloy, stainless steel (SUS), and the like are preferably used. It is preferable that at least the surface of the temperature controlling base part 3 that is exposed to the plasma is subjected to an alumite treatment or an insulating film such as alumina is formed on the surface.

In addition, the temperature controlling base part 3 has a plurality of through holes penetrating the temperature controlling base part 3 in the thickness direction. The through holes will be described in detail later.

An insulating plate 7 is bonded via an adhesion layer 6 to the upper surface side of the temperature controlling base part 3. Although the adhesion layer 6 is any selectable adhesion layer, it is preferable that the adhesion layer 6 is made of a heat-resistant, insulating, and sheet-shaped or film-shaped adhesive resin such as a polyimide resin, a silicone resin, and an epoxy resin. The adhesion layer is formed to have a thickness of, for example, approximately 5 μm to 100 μm. Although the insulating plate 7 is any selectable insulating plate, the insulating plate 7 is made of a thin plate, a sheet, or a film of a heat-resistant resin such as a polyimide resin, an epoxy resin, and an acrylic resin.

It should be noted that the insulating plate 7 may be an insulating ceramic plate instead of a resin sheet or may be a sprayed film having insulating properties such as alumina.

Figure 2:
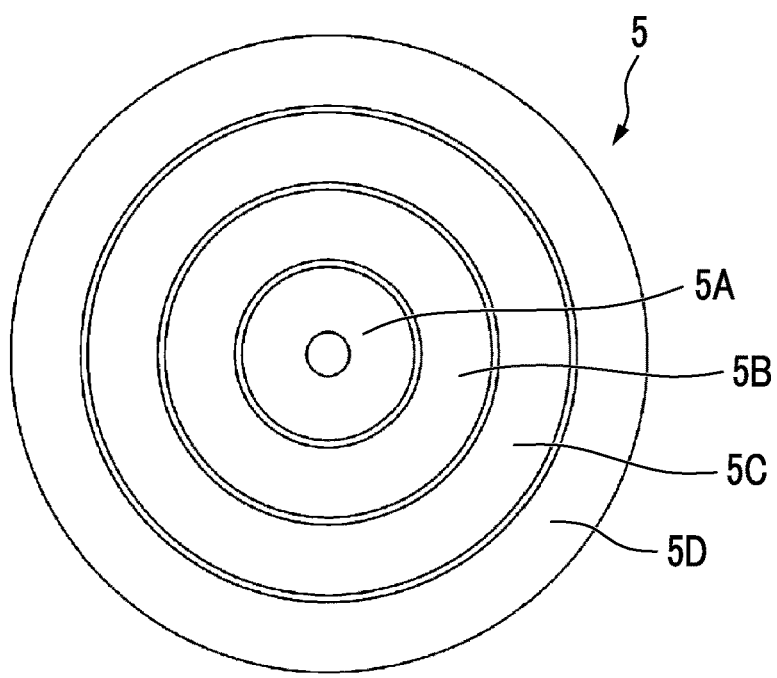
FIG. 2 is a schematic plan view illustrating an example of a pattern of a heater element.

FIG. 2 is a schematic plan view illustrating an example of a heater element pattern that can be used in the present invention. Although each heater preferably has a shape such as a meandering band shape, the shape is omitted here for easier understanding of the description.

The heater element 5 has four heater regions provided in a circular region as illustrated in FIG. 2. Specifically, the regions are a first main heater 5A disposed in the annular (doughnut-shaped) region of the center portion and a second main heater 5B, a third main heater 5C, and a fourth main heater 5D disposed in annular regions so as to sequentially surround the first main heater 5A. Preferably, the total region of the regions where the first to fourth main heaters 5A to 5D are disposed has approximately the same size as the disk-shaped electrostatic chuck part 2 in plan view as illustrated in FIG. 2. The entire annular region illustrated in FIG. 2 corresponds to the "circular region" of the present invention.

It should be noted that the circular region is provided inside or outside the electrostatic chuck part. These annular regions may be provided in, for example, the adhesive layer.

Although areas for separating the heaters are provided between the annular regions illustrated in FIG. 2, these areas may not be provided insofar as the heaters in the annular regions are separable. In addition, any unproblematic width and shape can be selected as the widths and shapes of these areas.

It should be noted that the main heaters 5A, 5B, 5C, and 5D are drawn in a simple annular shape in plan view in FIG. 2. However, each of the actual main heaters 5A, 5B, 5C, and 5D is preferably disposed such that the band-shaped heater meanders and the annular region illustrated in FIG. 2 is densely occupied. Accordingly, in the cross-sectional structure illustrated in FIG. 1, the band-shaped heaters respectively constituting the main heaters 5A, 5B, 5C, and 5D are individually drawn. It should be noted that the meandering pattern of the heater can be any selectable and unproblematic meandering pattern. The pattern may have a linear site in addition to a curved site. It is also preferable that the heater has a part disposed in a zigzag shape.

Figure 3:
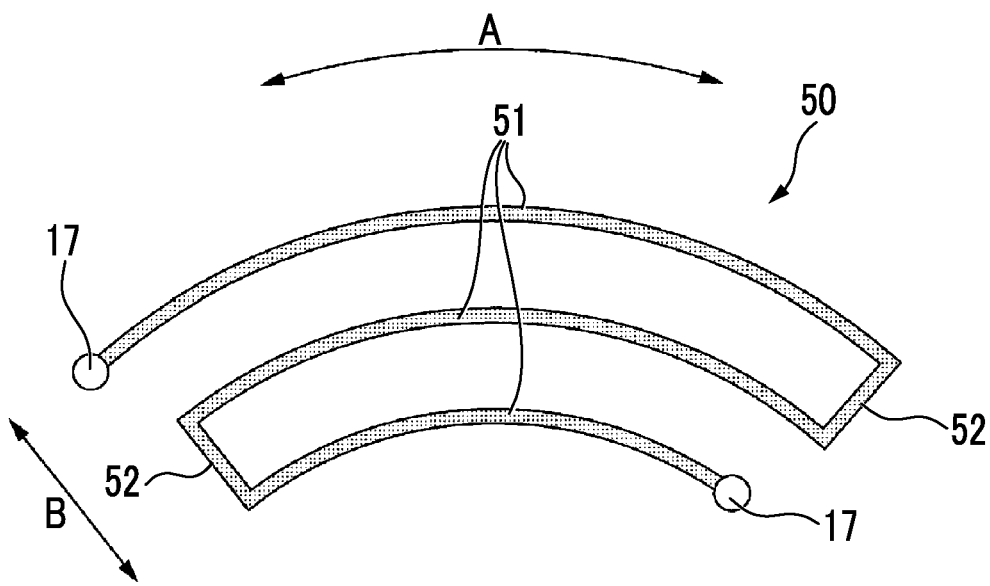
FIG. 3 is a schematic explanatory view for describing a main heater constituting the heater element.

FIG. 3 is an explanatory view illustrating a preferred example regarding the main heaters 5A, 5B, 5C, and 5D constituting the heater element 5. Here, the main heaters 5A, 5B, 5C, and 5D are represented by reference numeral 50 and described as "heater 50".

The heater 50 is a continuous band-shaped member disposed in the circular region. The heater 50 has a plurality of first members 51 having an arc shape and a second member 52 connecting two of the plurality of first members 51 that are adjacent to each other.

The first member 51 extends in the circumferential direction of the electrostatic chuck part 2 (double arrow direction indicated by reference symbol A in the drawing) with respect to the electrostatic chuck part 2 having a disk shape in plan view. The plurality of first members 51 are concentrically arranged in a plurality of rows in the circular region described above. Any length and number can be selected as the lengths and numbers of the first and second members. It should be noted that one annular region may include a plurality of heaters if necessary.

In addition, the second member 52 extends in the radial direction of the electrostatic chuck part 2 (double arrow direction indicated by reference symbol B in the drawing). It should be noted that the "radial direction" in which the second member 52 extends is not limited to the extension direction of a straight line passing through the center of the circular region. Insofar as two first members 51 having different distances from the center of the circular region are connected, the extension direction of the second member 52 may obliquely intersect with the radial direction without exactly matching the radial direction of the circular region.

The heater 50 can be formed by any selected method. For example, a nonmagnetic and thin metal plate having a thickness of 0.2 mm or less, preferably a constant thickness of approximately 0.1 mm, is prepared, examples of which include a thin titanium (Ti) plate, a thin tungsten (W) plate, and a thin molybdenum (Mo) plate. It is possible to obtain the heater 50 by processing this into a desired heater shape by a photolithography method or laser processing, examples of the heater shape including a shape in which a band-shaped, conductive, and thin plate meanders and the overall contour is annular.

The heater 50 may also be molded by the surface of the electrostatic chuck part 2 being processed after a nonmagnetic and thin metal plate is bonded to the electrostatic chuck part 2. Alternatively, what is formed by the heater 50 being processed and molded at a position different from the electrostatic chuck part 2 may be transfer-printed on the surface of the electrostatic chuck part 2.

The configuration of the heater 50 will be described in detail later.

Returning to FIG. 1, the heater element 5 is bonded and fixed to the bottom surface of the supporting plate 12 by the adhesion layer 4, which is made of a sheet- or film-shaped silicone or acrylic resin having a uniform thickness, heat resistance, and insulating properties.

The heater element 5 includes the main heaters 5A, 5B, 5C, and 5D as described above. The electrostatic chuck device is provided with a plurality of power supply terminals 17 for supplying power to the individual main heaters 5A, 5B, 5C, and 5D. FIG. 2 illustrates only the general, that is, rough shapes of the main heaters 5A, 5B, 5C, and 5D. In each of these heaters, a conducting portion for connection to a power supply is provided on one end side and an other end side of each heater. Accordingly, the heater element 5 is provided with a total of eight power supply terminals 17, two for each of the main heaters 5A, 5B, 5C, and 5D.

FIG. 1 illustrates only one power supply terminal 17 connected to the heater element 5 for simplification of the description. This power supply terminal 17 is disposed so as to partially penetrate the temperature controlling base part 3, the insulating plate 7, and the adhesive layer 8 present therearound in the thickness directions thereof. In addition, the temperature controlling base part 3 and the power supply terminal 17 are insulated from each other by a tubular insulator 18 for insulation being mounted on the outer peripheral surface of the power supply terminal 17.

Although any material can be selected as the material constituting the power supply terminal 17, a material equivalent to the material by which the power supply terminal 15 is configured can be preferably used.

Although not all power supply terminals 17 are illustrated in FIG. 1, two power supply terminals 17 are connected to each of the main heaters 5A, 5B, 5C, and 5D. A switch element (not illustrated) and a power supply (not illustrated) are connected to each of the main heaters 5A, 5B, 5C, and 5D via the two power supply terminals 17, and the energization of the main heaters 5A, 5B, 5C, and 5D is controlled as a result.

Each of the power supply terminals 17 is inserted in a through hole 3b formed in the temperature controlling base part 3, and each of the power supply terminals 17 is provided so as to penetrate the insulating plate 7 as well in a case where the power supply terminal 17 is connected to any of the main heaters 5A, 5B, 5C, and 5D.

According to the configuration described above, the individual energization and heat generation of each of the main heaters 5A, 5B, 5C, and 5D are controlled in accordance with the operation of the switch element and the power supply.

In addition, a temperature sensor 20 is provided on the lower surface side of the heater element 5 (main heaters 5A, 5B, 5C, and 5D). In the structure of FIG. 1, installation holes 21 are formed to penetrate the temperature controlling base part 3 and the insulating plate 7 in the thickness direction and the temperature sensor 20 is installed in the uppermost portions in these installation holes 21. It should be noted that the temperature sensor 20 is desirably installed as close to the heater element 5 as possible. Accordingly, from the structure of FIG. 1, the installation hole 21 may be further formed to extend so as to protrude to the adhesive layer 8 side and the temperature sensor 20 and the heater element 5 may be brought close to each other.

Although the temperature sensor 20 is any selectable temperature sensor, it is preferable that the temperature sensor 20 is, for example, a fluorescence emission-type temperature sensor in which a phosphor layer is formed on the upper surface side of a rectangular parallelepiped translucent body made of quartz glass or the like. It is also preferable that this temperature sensor 20 is bonded to the lower surface of the heater element 5 (main heaters 5A, 5B, 5C, and 5D) by means of, for example, a translucent, heat-resistant, and silicone resin-based adhesive.

The phosphor layer is made of a material that generates fluorescence in response to heat generation from the main heater, and various fluorescent materials can be selected insofar as the materials generate fluorescence in response to the heat generation. For example, a fluorescent material to which a rare earth element having an energy level suitable for light emission is added, a semiconductor material such as AlGaAs, a metal oxide such as magnesium oxide, or a mineral such as ruby and sapphire can be appropriately selected and used.

The temperature sensors 20 corresponding to the main heaters 5A, 5B, 5C, and 5D are respectively provided at positions not interfering with a power supply terminal or the like, which are any positions in the circumferential direction of the lower surfaces of the main heaters 5A, 5B, 5C, and 5D.

A temperature measurement unit 22, which measures the temperatures of the main heaters 5A to 5D from the fluorescence of these temperature sensors 20, may have the configuration that is illustrated in, for example, FIG. 1. Specifically, as illustrated in FIG. 1, the temperature measurement unit 22 preferably includes an excitation unit 23 irradiating the phosphor layer with excitation light outside (on the lower side of) the installation hole 21 of the temperature controlling base part 3, a fluorescence detector 24 detecting the fluorescence emitted from the phosphor layer, and a control unit 25 controlling the excitation unit 23 and the fluorescence detector 24 and calculating the temperature of the main heater based on the fluorescence.

Further, the electrostatic chuck device 1 has a pin insertion hole 28 provided so as to penetrate the temperature controlling base part 3 to the placement plate 11 in the thickness directions thereof. A lift pin for detaching the plate-shaped sample is inserted through the pin insertion hole 28. A tubular insulator 29 is provided in the inner peripheral portion of the pin insertion hole 28.

Further, the electrostatic chuck device 1 preferably has a gas hole (not illustrated) provided so as to communicate with the temperature controlling base part 3 to the placement plate 11 in the thickness directions. The same configuration as, for example, the pin insertion hole 28 can be adopted for the gas hole. A cooling gas for cooling the plate-shaped sample is supplied to the gas hole. The cooling gas is supplied to the groove 19 and the placement surface 11a via the gas hole and cools the plate-shaped sample.

The basic configuration of the electrostatic chuck device 1 has the above-described configuration.

In the electrostatic chuck device 1 as described above, the positions where the through holes (pin insertion hole 28 and gas hole) are provided are less likely to be heated than a through hole-less position. In addition, the manner in which heat is transmitted differs between the position where the through hole is provided and the through hole-less position. Accordingly, in a case where the temperature of the plate-shaped sample W placed on the placement surface 11a is controlled, a difference in temperature easily occurred between the part of the plate-shaped sample W that overlaps the through hole and the part of the plate-shaped sample W that does not overlap the through hole.

In this regard, in the electrostatic chuck device 1 in the present embodiment, the pattern of the heater element (heater 50) is devised so that the in-plane temperature difference of the plate-shaped sample W that occurs around the through holes such as the pin insertion hole 28 and the gas hole is reduced.

Hereinafter, an embodiment of the present invention will be described by exemplification of a plurality of preferable heater shapes.

(Heater 50A)

Figure 4:
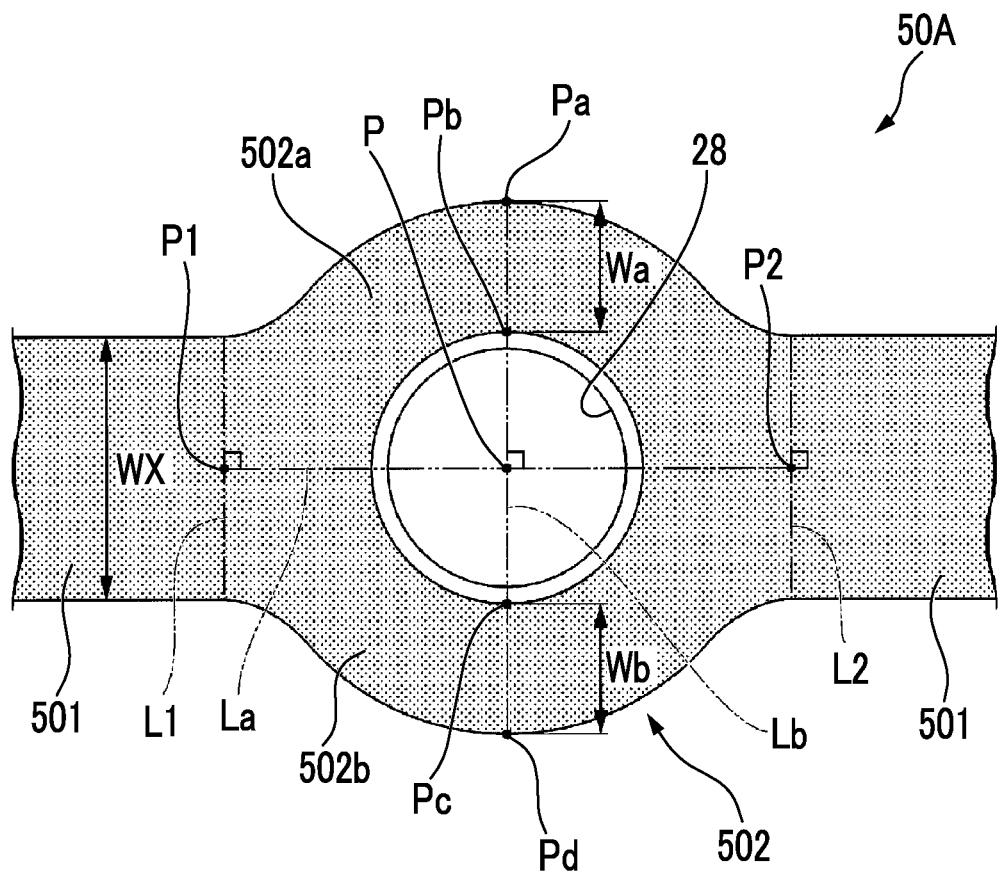
FIG. 4 is a schematic diagram illustrating a part of a heater 50A disposed near a pin insertion hole 28.

FIG. 4 is a schematic diagram illustrating an example of a part of a heater 50A disposed near the pin insertion hole 28. As illustrated in the drawing, the heater 50A disposed so as to surround the pin insertion hole 28 has a first site 501 formed in a band shape and a linear shape and a second site 502 continuous with the first site 501 and formed in a band shape and a closed ring shape. In this manner, the second site 502 has at least one opening and has first and second pattern portions across this opening portion.

Specifically, the heater 50A is continuously connected in the order of the first site 501, the second site 502, and the first site 501 in the extension direction. The first sites 501 on both sides of the second site 502 of FIG. 4 are linearly formed along a common center line.

The pin insertion hole 28 is disposed on the inner peripheral side of the second site 502 and is surrounded by the second site 502.

In the heater 50A, the width of the second site 502, that is, the width of each of the two sites about the hole of the second site 502 is preferably formed to be in the range of 0.25 times to 0.75 times the width of the first site 501. More preferably, the width of the second site 502 is in the range of 0.45 times to 0.55 times the width of the first site 501.

Here, the "width" of the first site 501 refers to the width-direction length of the first site 501 when the width direction is orthogonal to the center line that extends in the extension direction of the first site 501.

In addition, the "width" of the second site 502 is determined as follows.

First, the width-direction centers of the first sites 501 disposed on both sides of the second site 502 are defined as points P1 and P2, respectively. The point P1 is the midpoint of a line segment L1 in the width direction of first site 501. The point P2 is the midpoint of a line segment L2 in the width direction of second site 502. At this time, a line segment connecting the points P1 and P2 is defined as a line segment La.

Next, four intersections between a line segment Lb and the peripheral edge portion of the second site 502 are respectively defined as points Pa, Pb, Pc, and Pd when the line segment Lb is assumed to be orthogonal to the line segment La and pass through a center P of the pin insertion hole 28 (through hole).

Regarding the second site 502, when a pattern disposed on one side as viewed from the line segment La is a pattern 502a and a pattern disposed on an other side is a pattern 502b, the distance between the points Pa and Pb disposed on the pattern 502a side is defined as the width of the pattern 502a. In addition, the distance between the points Pc and Pd disposed on the pattern 502b side is defined as the width of the pattern 502b.

The "width" of the second site 502 indicates each of the width of the pattern 502a (that is, the distance between the points Pa and Pb) and the width of the pattern 502b (that is, the distance between the points Pc and Pd).

In other words, in the electrostatic chuck device 1 of the present embodiment, each of widths Wa and Wb of the second site 502 of the heater 50A is preferably formed to be included in the range of 0.25 times to 0.75 times a width WX of the first site 501. In addition, it is more preferable that each of the widths Wa and Wb of the second site 502 is included in the range of 0.45 times to 0.55 times the width WX of the first site. Wa and Wb may be equal to or different from each other as necessary.

Further, it is preferable that the sum of the widths Wa and Wb of the second site 502 is substantially equal to the width WX. At the second site 502, the electric current that flows through the first site 501 flows in parallel to the two paths of the patterns 502a and 502b. When the electric current flowing through the first site 501 flows to the second site 502 in a case where the sum of the widths Wa and Wb is substantially equal to the width WX, a difference in electric resistance hardly occurs at the connection position between the first site 501 and the second site 502 and uniform heat generation is easily obtained.

The heater performs heating by using the resistance heat generation at a time when the band-shaped, conductive, and thin plate is energized. Since the widths Wa and Wb of the second site 502 are included in the range of 0.25 times to 0.75 times the width WX of the first site 501, an appropriate amount of electric current can be supplied to the second site 502 and desired heat generation can be performed with ease.

(Heater 50B and Heater 50C)

Figure 5:
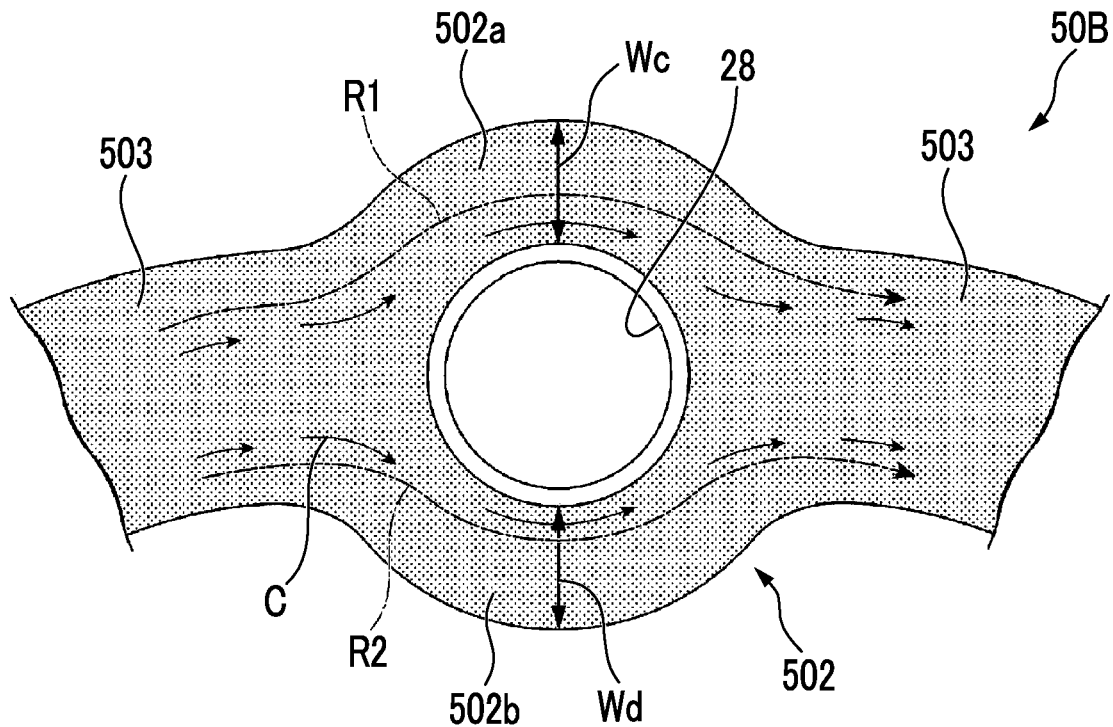
FIG. 5 is a schematic diagram illustrating a part of a heater 50B.
Figure 6:
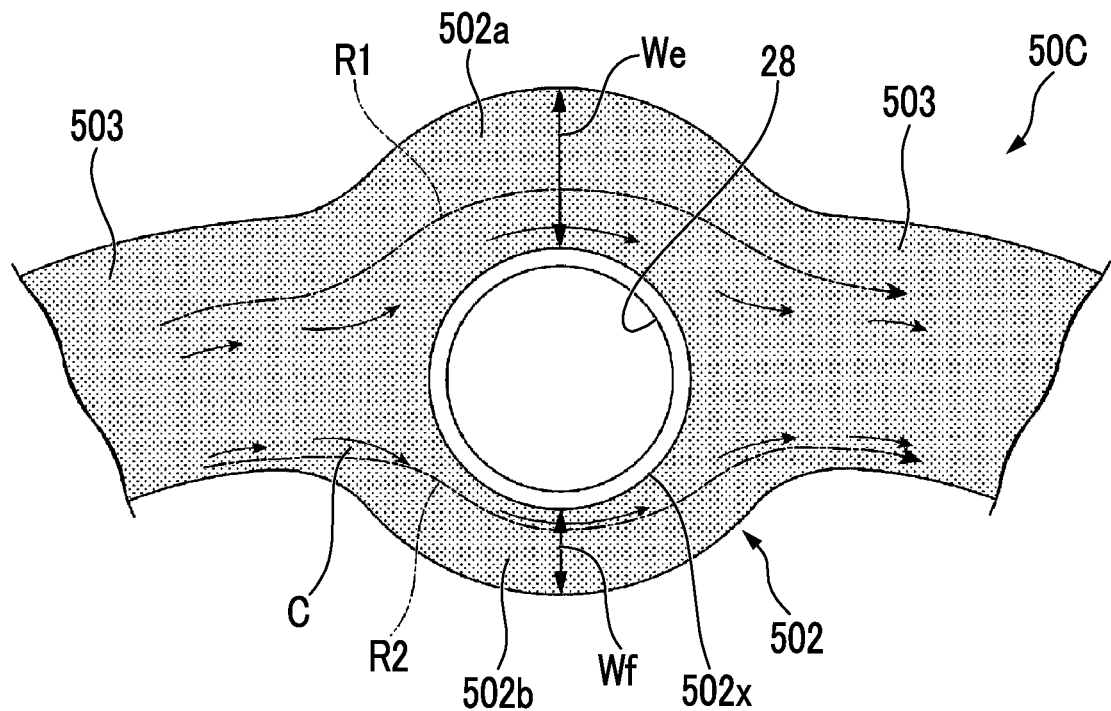
FIG. 6 is a schematic diagram illustrating a part of a heater 50C.

FIGS. 5 and 6 are schematic diagrams illustrating examples of a heater 50B and a heater 50C disposed near the pin insertion hole 28, respectively. As illustrated in FIGS. 5 and 6, the heater 50B, 50C disposed so as to surround the pin insertion hole 28 has a first site 503 formed to be curved in a band shape and an arc shape and the second site 502 continuous with the first site 503 and formed in a band shape and a closed ring shape.

In addition, in FIGS. 5 and 6, an electric current C flowing through the heater 50B, 50C is indicated by arrows.

The heater 50B illustrated in FIG. 5 differs from the above-described heater 50A illustrated in FIG. 4 only in the shape of the first site.

At the second site 502, the electric current that flows through the first site 501 flows in parallel to the two paths of the pattern 502a (first pattern portion) and the pattern 502b (second pattern portion). Meanwhile, the electric current has the property of traveling through the shortest path. Accordingly, when the first site 503 is curved as in the heater 50B in a case where a width We of the pattern 502a is substantially equal to a width Wd of the pattern 502b, the inside (concave side) of the first site 503 is more easily energized than the outside (convex side) of the curved first site 503 when the heater is energized.

As a result, the amount of the electric current C flowing through a current path R2 arranged in the order of the first site 503, the pattern 502b, and the first site 503 is likely to exceed the amount of the electric current C flowing through a current path R1 arranged in the order of the first site 503, the pattern 502a, and the first site 503. In addition, the pattern 502b generates heat more easily than the pattern 502a.

Also in the heater 50B, as in the above-described heater 50A, an appropriate amount of electric current is supplied to the second site 502 and desired heat generation is performed with ease by the width of the second site 502 being set to a range of a predetermined size with respect to the width of the first site 503. However, the heat generation amount at the second site 502 may become non-uniform for the above-described reason.

On the other hand, the heater 50C illustrated in FIG. 6 also has the first site 503 formed to be curved in a band shape and an arc shape and the second site 502 continuous with the first site 503 and formed in a band shape and a closed ring shape. However, as illustrated in FIG. 6, at the second site 502, the position of an inner peripheral edge 502x is shifted and the pattern 502a outside the curved first site 503 is formed thicker than the pattern 502b inside the first site 503. In other words, a width We of a pattern 504a is larger than a width Wf of the pattern 502b.

At the second site 502 in the heater 50C, the wide pattern 502a has lower electric resistance and is more easily energized than the relatively narrow pattern 502b. Accordingly, in the heater 50C, the difference in energization amount between the current path R1 and the current path R2 that has occurred in the heater 50B described above can be corrected and the difference in heat generation amount between the pattern 502a and the pattern 502b can be reduced. As a result, the heater 50C has a uniform heat generation amount also at the second site 502.

(Heater 50D)

Figure 7:
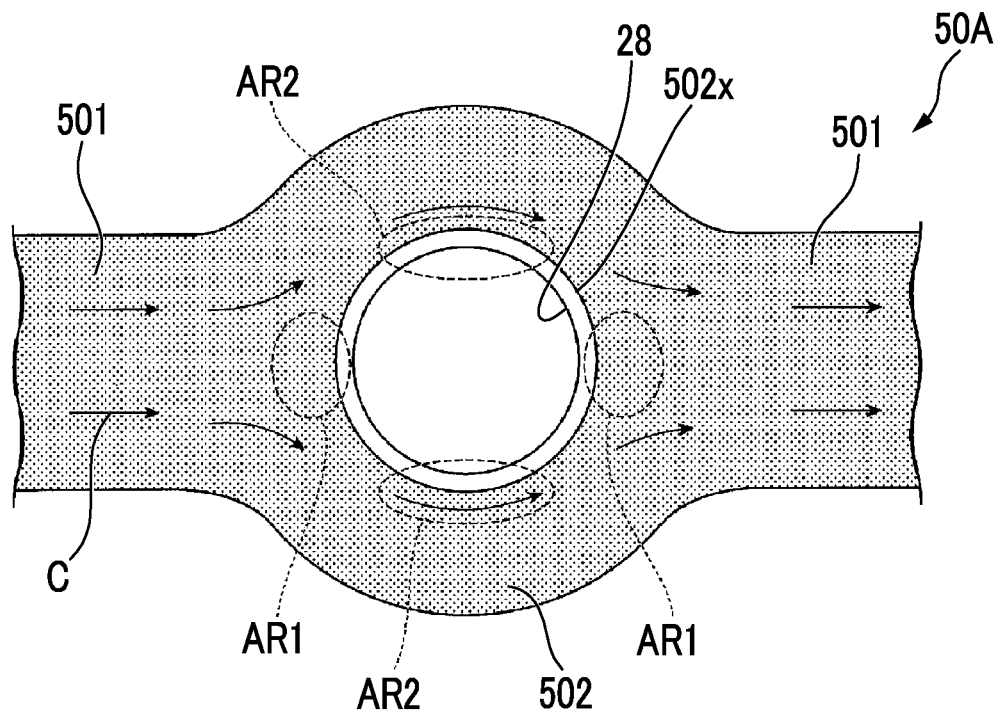
FIG. 7 is an explanatory view of the heater 50A.
Figure 8:
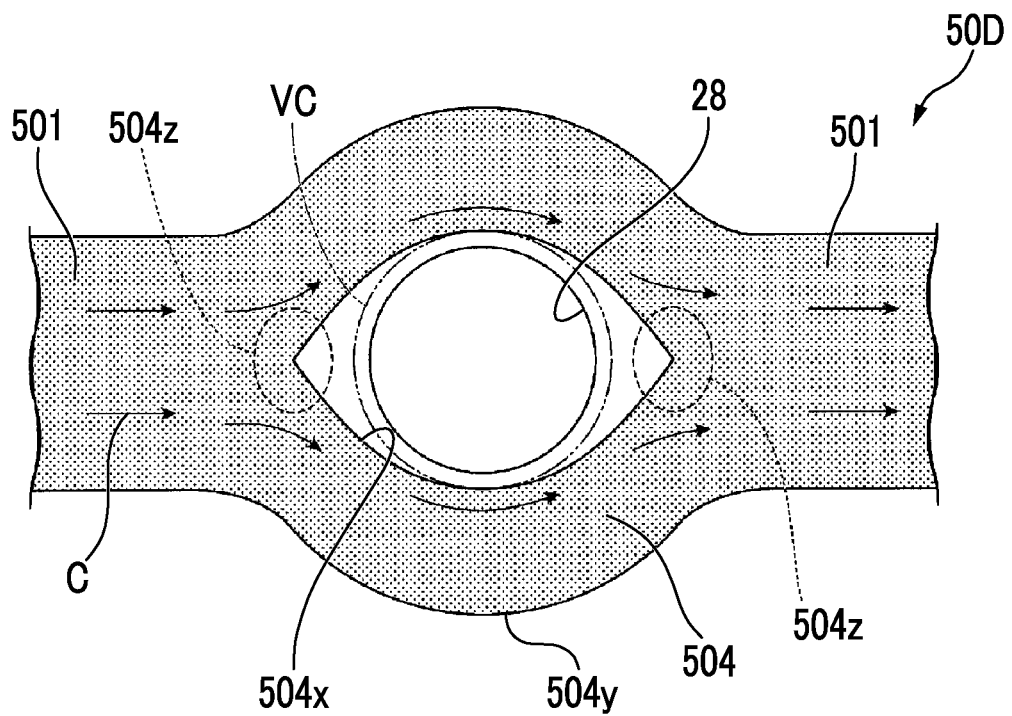
FIG. 8 is an explanatory view of a heater 50D.

FIGS. 7 and 8 are explanatory views for describing a heater D disposed near the pin insertion hole 28. FIG. 7 is an explanatory view of the heater 50A described above. FIG. 8 is an explanatory view of the heater 50D.

First, the electric current C flows through the shortest path in the heater 50A in a case where the heater 50A illustrated in FIG. 7 is energized. Accordingly, the electric current C hardly flows to a region AR1 of the inner peripheral edge 502x of the second site 502 that faces the first site 501 and easily flows to a region AR2 of the inner peripheral edge 502x of the second site 502 that does not face the first site 501. Accordingly, heat is unlikely to be generated in the region AR1, heat is easily generated in the region AR2, and a difference in heat generation amount may arise around the pin insertion hole 28.

On the other hand, the heater 50D illustrated in FIG. 8 has the first site 501 formed to be curved in a band shape and a linear shape and a second site 504 continuous with the first site 501 and formed in a band shape and a closed ring shape. The heater 50A illustrated in FIG. 7 and the heater 50D illustrated in FIG. 8 differ from each other only in the configuration of the second site.

At the second site 504, the shape of an inner peripheral edge 504x in plan view protrudes (is convex) to the first site 501 side as compared with a virtual inscribed circle VC of the inner peripheral edge 504x. In FIG. 8, the region that protrudes to the first site 501 side at the inner peripheral edge 504x is indicated by reference numeral 504z. In plan view, the opening of the second site 504 has an almond shape that is in line symmetry with respect to a center line with two curves joined at two points.

Since the heater 50D has such a configuration, the region where the electric current C hardly flows and heat generation hardly occurs in the vicinity of the inner peripheral edge 504x can be reduced and it is possible to make a difference in heat generation amount in the vicinity of the inner peripheral edge 504x less likely to occur.

It should be noted that the above-described effect can be obtained, even when the width of the second site 504 is not in the range of 0.25 times to 0.75 times the width of the first site 501, when the relationship of protrusion to the first site 501 side is satisfied as compared with the virtual inscribed circle VC of the inner peripheral edge 504x. In other words, an appropriate amount of electric current can be supplied to the second site 504 and desired heat generation can be performed.

In addition, the shape of the inner peripheral edge 504x in plan view is not particularly limited insofar as the relationship of the edge protrusion to the first site 501 side is satisfied as compared with the virtual inscribed circle VC of the inner peripheral edge 504x. For example, the shape may be a polygonal shape or an elliptical shape in addition to the shape illustrated in FIG. 8. In other words, any shape such as a polygonal shape and an elliptical shape can be selected as the shape of the opening in the second site 504.

Further, the shape of an outer peripheral edge 504y of the second site 504 in plan view may follow the shape of the inner peripheral edge 504x in plan view such that the width of the second site 504 is constant.

A configuration having the first site formed in a band shape and the second site continuous with the first site and formed in a band shape and a closed ring shape as in the heaters 50A to 50D described above can be provided at any position. For example, the configuration may be adopted for the first member 51 or may be adopted for the second member 52 in the heater 50 illustrated in FIG. 3.

In a normal heater element, the arc-shaped first member 51 occupies most of the total area of the heater element. Accordingly, in a case where the first member 51 has the above-described and closed ring-shaped second site in the heater element 5, the degree of freedom in the formation position of the second site is high, the design of the heater element is easy, and the configuration becomes simple.

In addition, the degree of freedom in design can be increased in a case where the second member 52 obliquely intersecting with the radial direction of the above-described circular region has the closed ring-shaped second site in the heater element 5.

Further, the first site can be linearly formed as in the heaters 50A and 50D in a case where the second member 52 extending in the radial direction of the above-described circular region has the closed ring-shaped second site in the heater element 5. Accordingly, there is no need to consider a difference in energization amount that may be caused by the first site being curved and a difference in heat generation amount at the second site is unlikely to occur.

Figure 9:
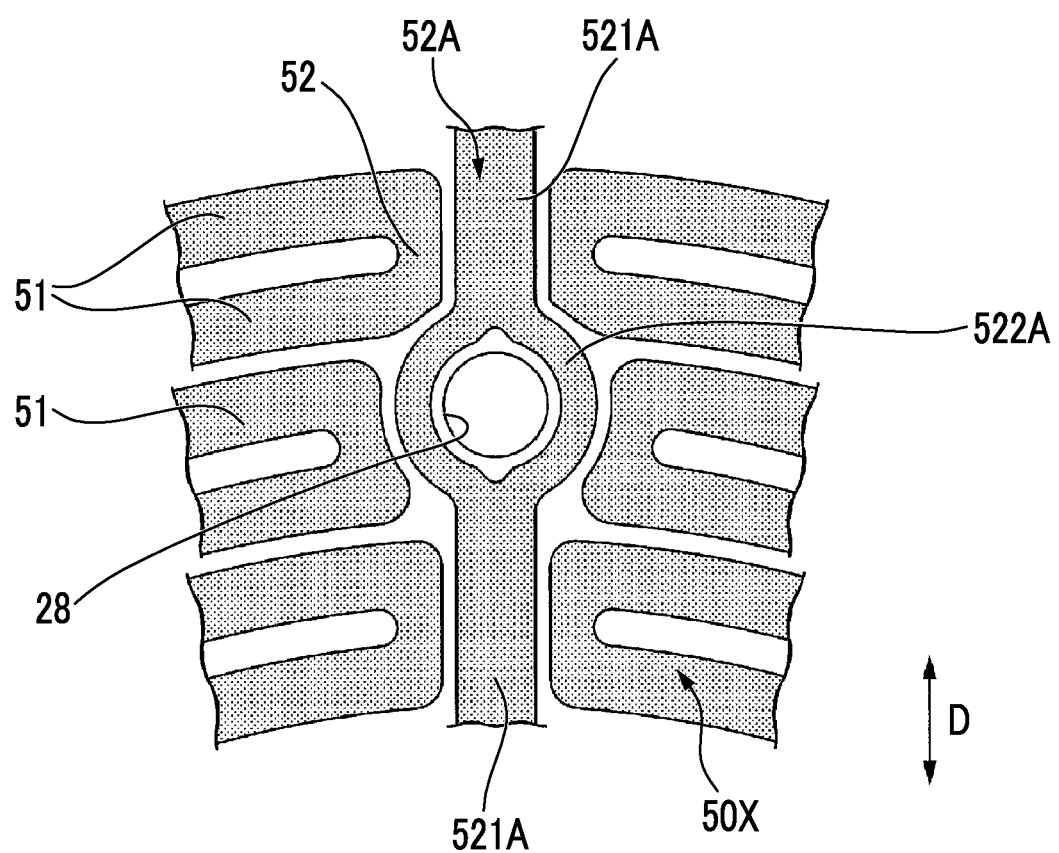
FIG. 9 is a schematic explanatory view illustrating a configuration around a second site.

FIG. 9 is an explanatory view illustrating a configuration around a second site 522A in the heater element 5 in which the second member 52 has the second site 522A. In the drawing, the double arrow indicated by symbol D indicates the radial direction.

A second member 52A extends in the radial direction. The second member 52A has a first site 521A formed in a band shape and a linear shape and the second site 522A continuous with the first site 521A and formed in a band shape and a closed ring shape.

A plurality of heaters 50X (six in total and three on each of both sides of the second member 52A in the drawing) are arranged in the radial direction around the second member 52A, and the heater 50X has two first members 51 and the second member 52 connecting the two first members 51 adjacent to each other. The plurality of heaters 50X may be connected to each other outside the display range of FIG. 9 to constitute one heater element.

With the heater element having such a configuration, it is possible to efficiently form a heater pattern around the pin insertion hole 28 and reduce a temperature difference attributable to a positional difference on the placement surface 11a.

In the electrostatic chuck device 1 having the heaters 50A to 50D as described above, it is possible to reduce the in-plane temperature difference of a plate-shaped member.

It is a matter of course that the present invention is not limited to the example although a preferred embodiment example according to the present invention have been described above with reference to the accompanying drawings. The shapes, combinations, and the like of the respective constituent members illustrated in the above-described example are merely examples and can be variously changed based on design requirements and the like and without departing from the gist of the present invention.

REFERENCE SIGNS LIST

1 Electrostatic chuck device
2 Electrostatic chuck part
3 Temperature controlling base part
3b, 16 Through hole
5 Heater element
11a Placement surface
13 Electrode for electrostatic attraction
19 Groove
19a Bottom surface
50, 50A, 50B, 50C, 50D, 50X Heater
501, 503, 521A First site
502, 504, 522A Second site
502x, 504x Inner peripheral edge
AR1, AR2 Region
VC Virtual inscribed circle
W Plate-shaped sample
Wa, Wb, Wc, Wd, We, Wf, WX Width

The invention claimed is:
1. An electrostatic chuck device comprising:
an electrostatic chuck part which has a placement surface on one main surface thereof to place a plate-shaped sample and has an electrode for electrostatic attraction;
a temperature controlling base part which is provided at a side opposite to the placement surface of the electrostatic chuck part and is configured to cool the electrostatic chuck part; and
a heater element disposed between the electrostatic chuck part and the temperature controlling base part or in the electrostatic chuck part in a layer form, wherein
the electrostatic chuck part and the temperature controlling base part are parts in which a plurality of through holes communicating in a thickness direction are provided,
the heater element has a first site formed in a band shape and a second site continuous with the first site,
wherein the second site is formed to have a band shape and a closed ring shape,
one through hole of the through holes is disposed on an inner peripheral side of the second site in plan view, and
a width of the second site is in a range of 0.25 times to 0.75 times a width of the first site.

2. The electrostatic chuck device according to claim 1, wherein a shape of an inner peripheral edge of the second site in plan view protrudes to a first site side as compared with a virtual inscribed circle of the inner peripheral edge.

3. The electrostatic chuck device according to claim 1, wherein the width of the second site is in a range of 0.45 times to 0.55 times the width of the first site.

4. The electrostatic chuck device according to claim 1, wherein
the heater element is disposed in a circular region,
a first members extend in a circumferential direction of the circular region.

5. The electrostatic chuck device according to claim 1, wherein
the heater element is disposed in a circular region,
the first site has first members and second members,
the first members extend in a circumferential direction of the circular region, and
the second member extend in a radial direction of the circular region.

6. The electrostatic chuck device according to claim 1, wherein
the heater element is disposed in a circular region,
the first site has first members and second members,
the first members extend in a circumferential direction of the circular region, and
the second member extend in a direction obliquely intersecting with a radial direction of the circular region.

7. An electrostatic chuck device comprising:
an electrostatic chuck part which has a placement surface on one main surface thereof to place a plate-shaped sample and has an electrode for electrostatic attraction;
a temperature controlling base part which is provided at a side opposite to the placement surface of the electrostatic chuck part and is configured to cool the electrostatic chuck part; and
a heater element disposed between the electrostatic chuck part and the temperature controlling base part or in the electrostatic chuck part in a layer form, wherein
the electrostatic chuck part and the temperature controlling base part are parts in which a plurality of through holes communicating in a thickness direction are provided,
the heater element has a first site formed in a band shape and a second site continuous with the first site, wherein the second site is formed to have a band shape and a closed ring shape, the through hole is disposed on an inner peripheral side of the second site in plan view, and
a shape of an inner peripheral edge of the second site in plan view protrudes to a first site side as compared with a virtual inscribed circle of the inner peripheral edge.

8. The electrostatic chuck device according to claim 7, wherein
the heater element is disposed in a circular region,
the first site has first members,
the first members extend in a circumferential direction of the circular region.

9. The electrostatic chuck device according to claim 7, wherein
the heater element is disposed in a circular region,
the first site has first members and second members,
the first members extend in a circumferential direction of the circular region, and
the second member extend in a radial direction of the circular region.

10. The electrostatic chuck device according to claim 7, wherein
the heater element is disposed in a circular region,
the first site has first members and second members,
the first members extend in a circumferential direction of the circular region, and
the second member extend in a direction obliquely intersecting with a radial direction of the circular region.

11. The electrostatic chuck device according to claim 7, wherein a width of the second site is in a range of 0.25 times to 0.75 times a width of the first site.

12. The electrostatic chuck device according to claim 7, wherein a width of the second site is in a range of 0.45 times to 0.55 times a width of the first site.

* * * * *